United States Patent [19]

Shores

[11] 4,177,427
[45] Dec. 4, 1979

[54] PHASE-NORMALIZED PARALLEL TUNED RECEIVER CHANNEL SYSTEM

[75] Inventor: Marvin W. Shores, Pomona, Calif.

[73] Assignee: General Dynamics Corporation, Pomona, Calif.

[21] Appl. No.: 892,527

[22] Filed: Apr. 3, 1978

[51] Int. Cl.² .......................... H03D 3/00; H04B 1/06
[52] U.S. Cl. ..................................... 325/369; 325/346
[58] Field of Search ............. 325/369, 301, 306, 30 T, 325/344, 346, 349, 366–368, 56, 41; 324/83 R, 83 A, 83 D, 83 FM; 330/86

[56] References Cited

U.S. PATENT DOCUMENTS

| | | | |
|---|---|---|---|
| 2,505,266 | 4/1950 | Villem | 325/56 |
| 2,786,133 | 3/1957 | Dyke | 325/31 |
| 2,951,152 | 8/1960 | Sichak | 325/369 |
| 3,036,210 | 5/1962 | Lehan | 325/369 |
| 3,047,815 | 7/1962 | Boose | 330/86 |
| 3,189,825 | 6/1965 | Lathi | 325/346 |
| 3,308,380 | 3/1967 | Graves | 325/346 |
| 3,528,012 | 9/1970 | Kahn | 325/368 |
| 3,911,364 | 10/1975 | Langseth | 325/301 |
| 4,037,165 | 7/1977 | Ogita | 325/346 |

Primary Examiner—Robert L. Griffin
Assistant Examiner—Tommy P. Chin
Attorney, Agent, or Firm—Edward W. Callan; Neil F. Martin; Edward B. Johnson

[57] ABSTRACT

A system having a plurality of parallel tuned receiver channels, wherein a normalized phase relationship is maintained in the respective channels between amplified pulsed high frequency carrier signals having a given frequency is disclosed. Each of a plurality of parallel channels for receiving pulsed high frequency carrier signals from disparate sources includes a tuned frequency amplifier for amplifying a given frequency component of a signal in the channel within a predetermined bandwith. A continuous wave reference signal having the given frequency is inserted into each channel before the input of the tuned frequency amplifier. For each channel a phase comparator compares the phase of the reference signal components of the amplified signal with the phase of the reference signal; and a phase adjuster controlled by the phase comparator responds to the phase comparison by adjusting the phase of the signal that is provided to the amplifier. A separate switch is connected to each channel for providing the amplified signal to the phase comparator for that channel. A pulse detector and processor circuit receives the amplified signal from the plurality of channels and detects a coherent pulsed signal when such is present in any of the amplified signals received from the separate channels. A switching control logic circuit is connected to the signal detector and processor circuit, for enabling the generation of the reference signal, and for enabling the switches to provide the amplified signals in the plurality of channels to all of the respective channel phase comparators simultaneously during a predetermined interval in response to detection of the coherent pulsed signal by the pulse detector and processor circuit, thereby causing the phase adjustments in the separate channels to be made simultaneously to normalize the phase shift between the reference signal and the amplified signals in the plurality of channels.

3 Claims, 3 Drawing Figures

PHASE-NORMALIZED PARALLEL TUNED RECEIVER CHANNEL SYSTEM

BACKGROUND OF THE INVENTION

The present invention generally pertains to detecting and processing signals from received high frequency electromagnetic radiation signals, and is particularly directed to maintaining a normalized phase relationship in the respective channels of a system having a plurality of tuned receiver channels.

The technology of detecting and processing intelligible signals from propogated electromagnetic energy has, since the early development of radio, almost totally utilized a down converter system. Basically, the down converter system converts the higher carrier signal frequencies to a lower frequency that is more practical to filter, amplify and process. The conversion involves the technique of modulating the received signal frequency f1 with a controlled local oscillator signal frequency f2 then selecting a specific product frequency from the spectral components generated by the intermodulation process. This process may be expressed by the following relationship.

$M(f1) \pm N(f2) = fn$ where:
M and N are integers defining the harmonic multipliers;
f1 is the frequency of a received signal;
f2 is the frequency of the local oscillator frequency; and
fn is the frequency produced by the sum or difference of f1 and f2 at any one of the various harmonics.

It is a general practice to select the lowest product (f1–f2) or (f2–f1) and suppress the others by a post-selective bandpass filter. Unfortunately the desired fn (or an intermediate frequency) can be reproduced by many harmonic combinations of f1 and f2. In most applications, this disadvantage of the down-converter system can be sufficiently overcome with a pre-selection circuit in the form of a bandpass filter tuned for the desired signal frequency.

In certain missle guidance systems, a configuration of parallel receiver channels for receiving and amplifying pulsed high frequency carrier signals is required. These receiver channels may be required to be tunable across a relatively wide frequency range with a minimal phase shift between the channels. This requirement precludes the use of tunable preselection filters which are inherently poor in phase tracking, particularly across a wide frequency range. Without preselective filtering, a down converter system is responsive to the various combinations of spurious frequencies f1 and harmonics thereof that will intermodulate with the various harmonics of f2 and produce the proper intermediate frequency.

A recognized alternative to the down-converter system is a system including tuned frequency amplifiers. Tuned frequency amplifiers provide an amplified signal that is effectively free of intermodulation products. However, the tuned frequency amplifier is highly unpredictable in phasing when tuned across a wide frequency band. Therefore, it has not been used in guidance systems where parallel channels having a normalized phase relationship are required.

The object of the present invention is to compensate for the phase tracking deficiency common to parallel channel tuned frequency amplifier systems.

SUMMARY OF THE INVENTION

The present invention is a system having a plurality of parallel tuned receiver channels, wherein a normalized phase relationship is maintained in the respective channels between amplified pulsed high frequency carrier signals having a given frequency. The system of the present invention includes a plurality of parallel channels for receiving pulsed high frequency carrier signals from disparate sources, wherein each channel includes a tuned frequency amplifier for amplifying a given frequency component of a signal in the channel within a predetermined bandwidth; a reference signal generator for generating a continuous wave reference signal having the given frequency; and an individual phase control loop for each of the channels for locking the amplified signal in the channel to the phase of the reference signal.

Each phase control loop includes a first in-line circulator connected in the channel before the input of the tuned frequency amplifier for inserting the reference signal into the loop; a phase comparator for comparing the phase of the reference signal components of the amplified signal with the phase of the reference signal; a phase adjuster controlled by the phase comparator and connected in the channel between the circulator and the tuned frequency amplifier for adjusting the phase of the signal from the circulator in response to said phase comparison; a second in-line circulator connected in the channel following the output of the amplifier; and a switch connected to the second in-line circulator for providing the amplified signal to the phase comparator.

The system further includes a pulse detector and processor circuit for receiving the amplified signals from the plurality of channels and for detecting a coherent pulsed signal in the received amplified signals; and a switching control logic circuit connected to the signal detector processor circuit, to the reference signal generator, and to each of the switches for enabling the reference signal generator to provide the reference signal, and for enabling the switches to provide the amplified signals in the plurality of channels to all of the respective channel comparators simultaneously during a predetermined interval in response to detection of a said coherent pulsed signal by the pulse detector and processor circuit, thereby causing the phase adjustments in the separate channels to be made simultaneously to normalize the phase shift between the reference signal and the amplified signals in the plurality of channels.

Preferably, the pulse detector and processor circuit is adapted for processing the detected coherent pulsed signals to determine the frequency and duration of the detected coherent pulses and for periodically providing a signal to the switching control logic circuit for causing the switching control logic circuit to periodically enable the reference signal generator and the switches during predetermined intervals between successively detected coherent pulses for so long as coherent pulsed signals are detected. Accordingly, the detected coherent pulsed signals are not contaminated by the reference signal.

In the preferred embodiment, the system of the present invention further includes a frequency controller connected to the reference signal generator and to each of the tuned frequency amplifiers to tune each of the tuned frequency amplifiers and the reference signal generator to the same frequency.

DESCRIPTION OF THE PREFERRED EMBODIMENT

Figure 1:
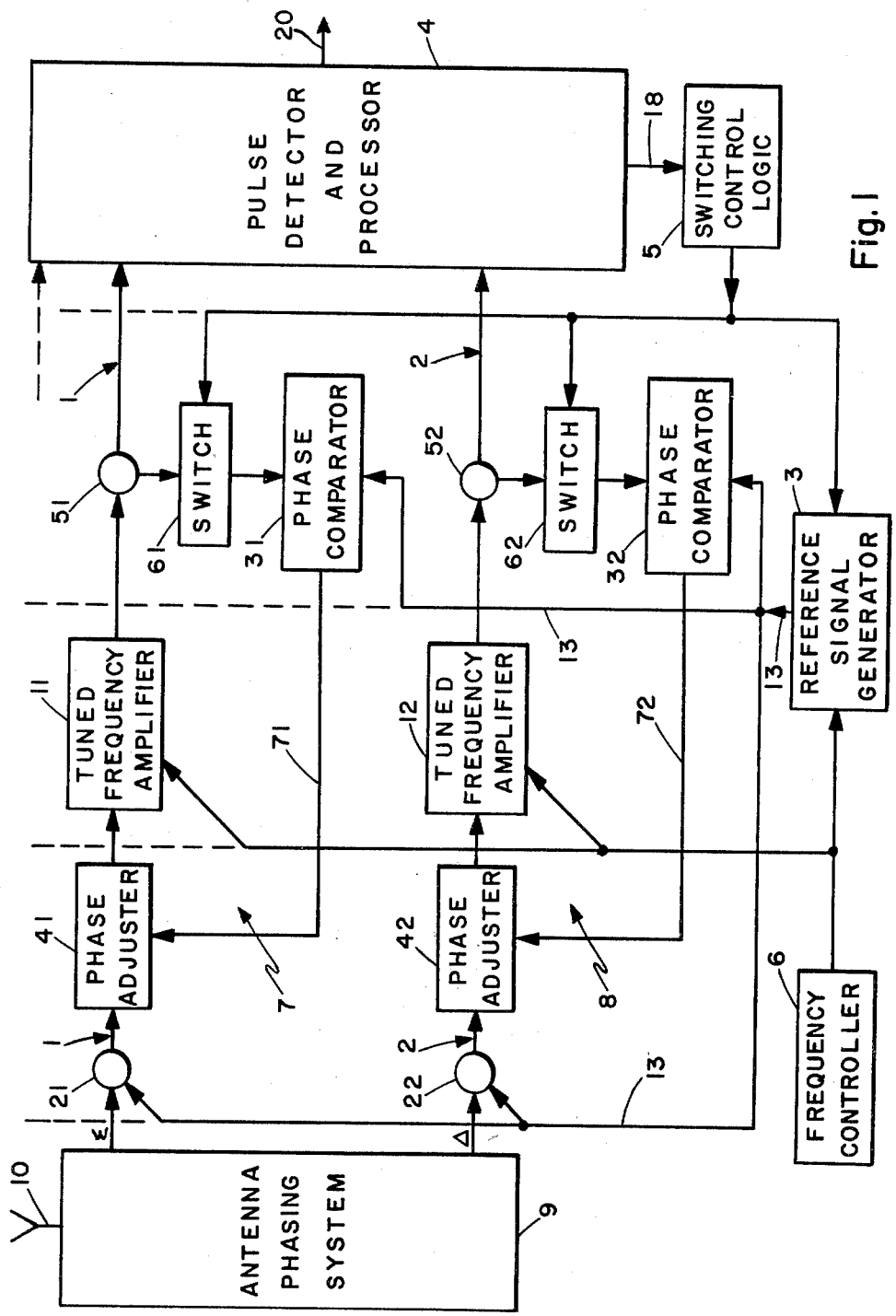
FIG. 1 is a schematic block diagram of the system of the present invention.

Referring to FIG. 1, the preferred embodiment of the system of the present invention includes a plurality of parallel tuned receiver channels 1, 2, a reference signal generator 3, a pulse detector and processor circuit 4, a switching control logic circuit 5, a frequency controller 6, and phase control loops 7, 8 for each of the channels 1, 2. Although only two channels are shown in FIG. 1, the system may include more than two channels. The dashed lines in FIG. 1 represent connections to additional channels.

The plurality of parallel channels 1, 2 are connected to an antenna phasing system 9. The antenna phasing system 9 is connected to a monopulsed phased array antenna 10, such as is used in most missile guidance systems. The antenna phasing system 9 resolves the angle of a received wavefront relative to the boresight error of the antenna 10 and provides pulsed high frequency carrier output signals, such as a summation signal ε on channel 1 and a difference signal Δ on channel 2. Each channel 1, 2 includes a tuned frequency amplifier 11, 12 for amplifying a given frequency component of a signal in the channel 1, 2 within a predetermined bandwidth.

The reference signal generator 3 is adapted for generating a continuous wave reference signal having the given frequency on line 13.

The frequency controller 6 is connected to the reference signal generator 3 and to each of the tuned frequency amplifiers 11, 12 to simultaneously tune each of the tuned frequency amplifiers 11, 12 and the reference signal generator 3 to the same given frequency.

There is an individual phase control loop 7, 8 for each of the channels 1, 2 for locking the amplified signal in the channel 1, 2 to the phase of the reference signal. Each phase control loop includes a first in-line circulator 21, 22, a phase comparator 31, 32, a phase adjuster 41, 42, a second in-line circulator 51, 52 and a switch 61, 62. The first in-line circular 21, 22 is connected in the channel 1, 2 before the input of the tuned frequency amplifier 11, 12 for inserting the reference signal from line 13 into the loop 7, 8.

The phase comparator 31, 32 is provided for comparing the phase of the reference signal components of the amplified signal from the output of the tuned frequency amplifier 11, 12 with the phase of the reference signal on line 13. The phase adjuster 41, 42 is connected in the channel 1, 2 between the first in-line circulator 21, 22 and the tuned frequency amplifier 11, 12 and is controlled by the phase comparator 31, 32 for adjusting the phase of the signal from the first in-line circulator 21, 22 in response to said phase comparison.

The second in-line circular 51, 52 is connected in the channel following the output of the amplifier 11, 12; and the switch 61, 62 is connected to the second in-line circular 51, 52 for providing the amplified signal from the tuned frequency amplifier 11, 12 to the phase comparator 31, 32.

The pulse detector and processor circuit 4 is adapted for receiving the amplified signals from the plurality of channels 1, 2 and for detecting a coherent pulsed signal in the received amplified signals from the tuned frequency amplifier 11, 12. The switching control logic circuit 5 is connected to the signal detector processor circuit 4, to the reference signal generator 3, and to each of the switches 61, 62 for enabling the reference signal generator 3 to provide the reference signal on line 13 and for enabling the switches 61, 62 to provide the amplified signals in the plurality of channels 1, 2 to all of the respective channel phase comparators 31, 32 simultaneously during a predetermined interval in response to detection of a said coherent pulsed signal by the pulse detector and processor circuit 4, thereby causing the phase adjustments in the separate channels 1, 2 to be made simultaneously to normalize the phase shift between the reference signal on line 13 and the amplified signals from the tune frequency amplifiers 11, 12 in the plurality of channels 1, 2.

Figure 2:
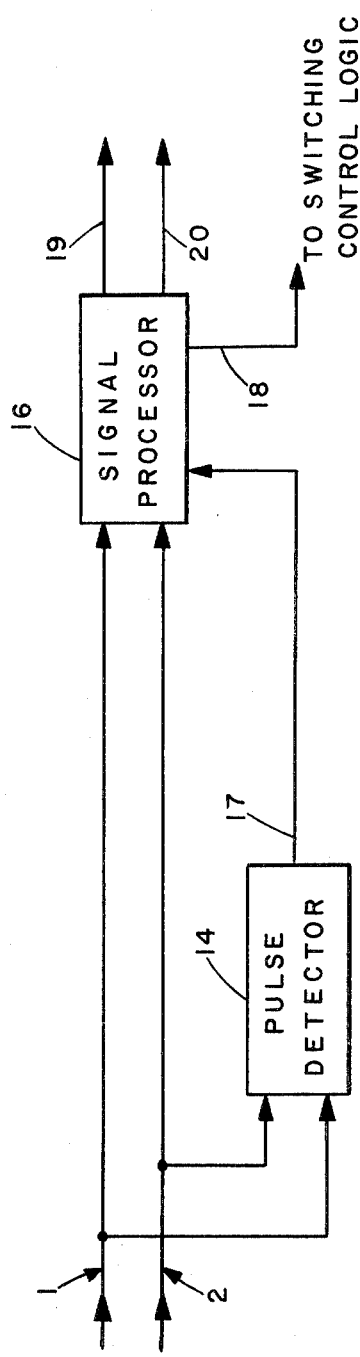
FIG. 2 is a schematic block diagram of the pulse detector and processor circuit included in the system shown in FIG. 1.
Figure 3:
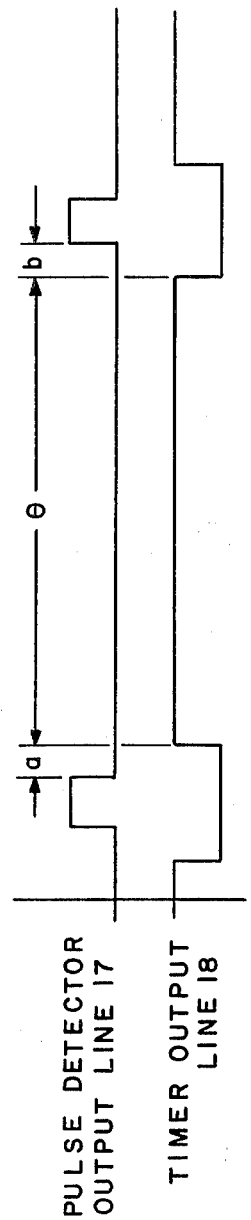
FIG. 3 shows the waveforms of certain signals provided to and from the signal processor in the circuit shown in FIG. 3.

Referring to FIG. 2, the pulse detector and processing circuit 4 includes a pulse detector 14 and a signal processor 16. The waveforms of certain signals provided to and from the signal processor 16 are shown in FIG. 3.

Initially, the reference signal generator 3 is off and the switches 61 and 62 are open. When the pulse detector 16 detects a coherent pulsed signal in either channel 1 or channel 2, the detected coherent signal pulse is provided on line 17 to the signal processor 16. The signal processor 16 processes the detected coherent signal pulses to determine the duration and frequency of the detected coherent pulses. In accordance with the determined duration and frequency of the detected coherent pulses, the signal processor 16 periodically provides an enabling signal pulse on line 18 to the switching control logic circuit 5 to periodically enable the reference signal generator 3 and the switches 61, 62 during predetermined intervals θ for so long as coherent pulsed signals are detected by the pulse detector 14. (See FIG. 3.) The predetermined interval begins an arbitrary duration "a" after the duration of the detected coherent pulse on line 17 and terminates an arbitrary duration "b" before the duration of the next detected coherent pulse on line 17 that is of the determined duration and occurs at the determined frequency. The predetermined interval θ occupies approximately 80% of each period.

The signal processor 16 also processes the amplified signals received on channels 1 and 2 to provide processed output signals on lines 19 and 20.

The tuned frequency amplifiers 11, 12 consist of a cascaded arrangement of voltage tunable narrow band amplifiers that satisfy the system gain and bandwidth requirements. The reference signal generator 3 is a voltage controlled oscillator. The tuned frequency amplifier 11, 12 and the reference signal generator 3 are simultaneously tuned to the desired given frequency by a DC voltage signal provided by the frequency controller 6.

The phase adjusters 41, 42 shift the phase in channels 1 and 2 respectively in response to DC voltage signals provided on line 71 and 72 from the respective phase comparators 31 and 32. The DC voltages on lines 71 and 72 are proportional to the respective phase differences measured by the phase comparators 31, 32.

The system of the present invention is particularly useful in missle guidance systems where a normalized phase relationship between amplified pulsed high frequency carrier signals in different channels is essential.

I claim:

1. A system having a plurality of parallel tuned receiver channels, wherein a normalized phase relationship is maintained in the respective channels between amplified pulsed high frequency carrier signals having a given frequency, comprising a plurality of parallel channels for receiving pulsed high frequency carrier signals from disparate sources, wherein each channel includes a tuned frequency amplifier for amplifying a given frequency component of a signal in the channel within a predetermined bandwidth;

a reference signal generator for generating a continuous wave reference signal having the given frequency; and an individual phase control loop for each of the channels for locking the amplified signal in the channel to the phase of the reference signal, wherein each phase control loop includes a first in-line circulator connected in the channel before the input of the tuned frequency amplifier for inserting the reference signal into the loop;

a phase comparator for comparing the phase of the reference signal components of the amplfied signal with the phase of the reference signal;

a phase adjuster controlled by the phase comparator and connected in the channel between the circular and the tuned frequency amplifier for adjusting the phase of the signal from the circulator in response to said phase comparison;

a second in-line circulator connected in the channel following the output of the amplifier; and a switch connected to the second in-line circulator for providing the amplifier signal to the phase comparator;

wherein the system further comprises a pulse detector and processor circuit for receiving the amplified signals from the plurality of channels and for detecting coherent pulsed signals in the received amplified signals; and a switching control logic circuit connected to the signal detector and processor circuit, to the reference signal generator, and to each of the switches for enabling the reference signal generator to provide the reference signal, and for enabling the switches to provide the amplified signals in the plurality of channels to all of the respective channel phase comparators simultaneously during a predetermined interval in response to detection of a said coherent pulsed signal by the pulse detector and processor circuit, thereby causing said phase adjustments in the separate channels to be made simultaneously to normalize the phase shift between the reference signal and the amplified signals in the plurality of channels.

2. A system according to claim 1, wherein the pulse detector and processor circuit in adapted for processing said detected coherent pulsed signals to determine the duration and frequency of said detected coherent pulses and for periodically providing a signal to the switching control logic circuit for causing the switching control logic circuit to periodically enable the reference signal generator and the switches during predetermined intervals between successively detected coherent pulses for so long as coherent pulsed signals are detected.

3. A system according to claim 1, further comprising a frequency controller connected to the reference signal generator and to each of the tuned frequency amplifiers to tune each of the tuned frequency amplifiers and the reference signal generator to the same frequency.

* * * * *